(12) United States Patent
Hirano

(10) Patent No.: US 8,866,251 B2
(45) Date of Patent: Oct. 21, 2014

(54) SOLID-STATE IMAGING ELEMENT HAVING OPTICAL WAVEGUIDE WITH INSULATING LAYER

(75) Inventor: Tomoyuki Hirano, Kanagawa (JP)

(73) Assignee: Sony Corporation (JP)

(*) Notice: Subject to any disclaimer, the term of this patent is extended or adjusted under 35 U.S.C. 154(b) by 449 days.

(21) Appl. No.: 12/355,238

(22) Filed: Jan. 16, 2009

(65) Prior Publication Data

US 2009/0189237 A1 Jul. 30, 2009

(30) Foreign Application Priority Data

Jan. 24, 2008 (JP) ................................. 2008-014054

(51) Int. Cl.
*H01L 31/101* (2006.01)
*H01L 27/146* (2006.01)

(52) U.S. Cl.
CPC .... *H01L 27/14625* (2013.01); *H01L 27/14612* (2013.01); *H01L 27/14603* (2013.01); *H01L 27/14609* (2013.01); *H01L 27/14627* (2013.01); *H01L 27/14643* (2013.01)
USPC .......................................... 257/462; 257/431

(58) Field of Classification Search
CPC ................................................. H01L 27/14612
USPC ......................................... 257/466, 462, 444
See application file for complete search history.

(56) References Cited

U.S. PATENT DOCUMENTS

| | | | | |
|---|---|---|---|---|
| 5,371,397 A | * | 12/1994 | Maegawa et al. | 257/432 |
| 6,433,366 B1 | * | 8/2002 | Takimoto et al. | 257/83 |
| 2004/0140564 A1 | * | 7/2004 | Lee et al. | 257/758 |
| 2005/0001146 A1 | * | 1/2005 | Quinlan | 250/214.1 |
| 2005/0072906 A1 | * | 4/2005 | Dobashi | 250/208.1 |
| 2005/0236553 A1 | * | 10/2005 | Noto et al. | 250/208.1 |
| 2006/0033126 A1 | * | 2/2006 | Mouli | 257/227 |
| 2007/0034981 A1 | * | 2/2007 | Saito | 257/462 |
| 2007/0200055 A1 | * | 8/2007 | Reznik et al. | 250/208.1 |
| 2009/0035887 A1 | * | 2/2009 | Suzuki et al. | 438/57 |

FOREIGN PATENT DOCUMENTS

| | | |
|---|---|---|
| JP | 2003-224249 | 8/2003 |
| JP | 2005-123280 | 5/2005 |
| JP | 2005-340498 | 12/2005 |
| JP | 2006-049825 | 2/2006 |
| JP | 2006-319037 | 11/2006 |
| JP | 2007-258684 | 4/2007 |
| WO | WO 2006115142 A1 * | 11/2006 |
| WO | WO 2007/081881 | 7/2007 |

OTHER PUBLICATIONS

"Polyethylene terephthalate (Polyester, PET, PETP) Material Information". Accessed from http://www.goodfellow.com/E/Polyethylene-terephthalate.html on Oct. 21, 2013.*

* cited by examiner

*Primary Examiner* — Allen Parker
(74) *Attorney, Agent, or Firm* — Sheridan Ross P.C.

(57) ABSTRACT

The present invention provides a solid-state imaging element including: a silicon layer having a photodiode formed therein and a positive charge accumulation region formed on the surface thereof; and an optical waveguide formed above the photodiode to guide incident light into the photodiode, wherein an insulating layer is formed in the optical waveguide, and the insulating layer has a dielectric constant of 5 or greater and negative fixed charge.

8 Claims, 8 Drawing Sheets

SOLID-STATE IMAGING ELEMENT HAVING OPTICAL WAVEGUIDE WITH INSULATING LAYER

CROSS REFERENCES TO RELATED APPLICATIONS

The present invention contains subject matter related to Japanese Patent Application JP 2008-014054, filed in the Japan Patent Office on Jan. 24, 2008, the entire contents of which being incorporated herein by reference.

BACKGROUND OF THE INVENTION

1. Field of the Invention

The present invention relates to a solid-state imaging element having, above a photodiode, an optical waveguide for guiding incident light into the photodiode.

2. Description of the Related Art

It is known in CCD (charge coupled device) and CMOS (complementary metal-oxide semiconductor) solid-state imaging elements that a crystalline defect in a photodiode and an interface state at the interface between a photoreceiving section and insulating layer on top thereof formed in a silicon substrate are attributable to dark current.

That is, as illustrated in the diagrammatic sectional view of FIG. 10A and the potential diagram of FIG. 10B, an interface state denoted by "x" develops at the interface between a silicon layer 51 and insulating layer 52 on top thereof. A photodiode PD is formed in the silicon layer 51. This interface state serves as a source of dark current, causing electrons originating from the interface to flow into the photodiode PD as a dark current.

The so-called HAD (hole accumulation diode) structure is employed to control the generation of dark current caused by an interface state among various causes of dark current (see, Japanese Patent Laid-Open No. 2005-123280 for example).

More specifically, as illustrated in the diagrammatic sectional view of FIG. 11A and the potential diagram of FIG. 11B, a p-type impurity is introduced in the vicinity of the surface of the silicon layer 51 to form a p$^+$ semiconductor region. This p$^+$ semiconductor region serves as a positive charge accumulation region 53 adapted to accumulate positive charge (holes).

Thus, the photodiode PD is separated from the interface if the HAD structure is provided by forming the positive charge accumulation region 53 at the interface. This makes it possible to suppress dark current caused by an interface state.

In order to form the HAD structure, B, BF$_2$ or other ions are injected at an annealing temperature to form a p$^+$ semiconductor region in the vicinity of the interface as the positive charge accumulation region 53.

In related art solid-state imaging elements, on the other hand, the provision of an optical waveguide having a well structure in the wiring layer on the photoreceiving region of the photoelectric conversion section (photodiode) is known to provide improved light collection efficiency onto the photo-receiving region (see, Japanese Patent Laid-Open No. 2003-224249 for example).

This configuration relies on a higher refractive index of the transparent core material in the optical waveguide than the interlayer insulating film (SiO$_2$). This configuration can provide improved light collection efficiency into the photodiode by totally reflecting incident light having an incidence angle greater than the critical angle which is determined by the interface between the transparent core material and interlayer insulating.

SUMMARY OF THE INVENTION

To provide improved effect of the above HAD structure, however, ions are injected at a high concentration during the manufacture of a solid-state imaging element having the HAD structure. This ion injection leads to damage, resulting in defects.

A possible solution to prevent such defects would be to form an insulating layer 55 having negative fixed charge 54 rather than a normal insulating layer 52 as an insulating layer to be formed on the silicon layer 51 as illustrated in the diagrammatic sectional view of FIG. 12A and the potential diagram of FIG. 12B. The photodiode PD is formed in the silicon layer 51.

This bends the band, thus allowing for accumulation of positive charge (holes) particularly in the vicinity of the interface as illustrated in FIG. 12B.

Incidentally, a groove must be formed for use as an optical waveguide, for example, by etching in the aforementioned solid-state imaging element having an optical waveguide.

Therefore, if the insulating layer 55 with the negative fixed charge 54 is applied in an "as-is" manner to a solid-state imaging element having an optical waveguide, the insulating layer 55 with the negative fixed charge 54, which has been formed in advance, will be trimmed during the formation of a groove serving as the optical waveguide, thus resulting in a reduced thickness.

If the insulating layer 55 with the negative fixed charge 54 is reduced in thickness as described above, the hole accumulation effect of the negative fixed charge will be reduced.

Therefore, a method must be devised to provide a sufficient hole accumulation effect if an insulating film with negative fixed charge is applied to a solid-state imaging element having an optical waveguide.

In order to solve the aforementioned problem, it is desirable for the present invention to provide a solid-state imaging element capable of providing a sufficient hole accumulation effect when the solid-state imaging element has an optical waveguide.

A solid-state imaging element of the present invention includes a silicon layer and an optical waveguide. A photodiode is formed in the silicon layer. A positive charge accumulation region is formed on the surface of the photodiode. The optical waveguide is formed above the photodiode and guides incident light into the photodiode. An insulating layer is formed in the optical waveguide. The insulating layer has a dielectric constant of 5 or greater and negative fixed charge.

According to the above configuration of the solid-state imaging element of the present invention, the insulating layer with a dielectric constant of 5 or greater and negative fixed charge is formed in the optical waveguide. As a result, positive charge (holes) can be accumulated in the vicinity of the interface of the silicon layer which forms the photodiode. This, together with the positive charge accumulation region of the silicon layer, allows for accumulation of positive charge (holes) in the vicinity of the interface, thus suppressing the generation of dark current caused by an interface state.

Further, an insulating layer with negative fixed charge is formed in the optical waveguide. As a result, the insulating layer with negative fixed charge has a relatively large volume, thus providing a sufficient hole accumulation effect (negative bias effect).

A solid-state imaging element of the present invention includes a silicon layer and an optical waveguide. A photodiode is formed in the silicon layer. A positive charge accumulation region is formed on the surface of the photodiode. The optical waveguide is formed above the photodiode and guides incident light into the photodiode. An insulating layer is formed on the photodiode. The insulating layer has a dielectric constant of 5 or greater and negative fixed charge. The optical waveguide is formed on the insulating film.

According to the above configuration of the solid-state imaging element of the present invention, the insulating layer with a dielectric constant of 5 or greater and negative fixed charge is formed on the photodiode, and the optical waveguide is formed on the insulating film. As a result, positive charge (holes) can be accumulated in the vicinity of the interface of the silicon layer which forms the photodiode. This, together with the positive charge accumulation region of the silicon layer, allows for accumulation of positive charge (holes) in the vicinity of the interface, thus suppressing the generation of dark current caused by an interface state.

Further, an insulating layer with negative fixed charge is formed closer to the photodiode than the optical waveguide, thus providing a sufficient hole accumulation effect (negative bias effect).

As described above, an embodiment the present invention provides a sufficient hole accumulation effect (negative bias effect), thus suppressing the generation of dark current caused by an interface state in a solid-state imaging element having an optical waveguide.

As a result, the present invention can provide a highly reliable solid-state imaging element capable of operating stably without generating any dark current.

DETAILED DESCRIPTION OF THE PREFERRED EMBODIMENT

Figure 1:
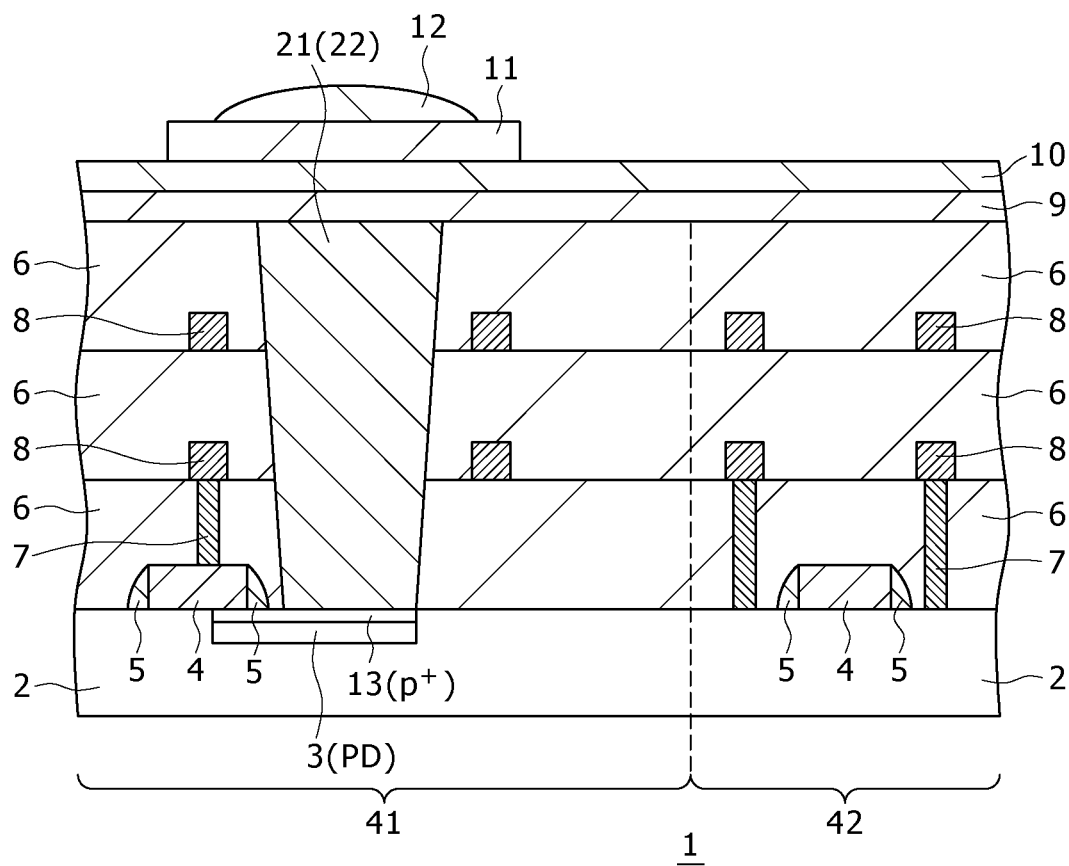
FIG. 1 is a schematic configuration diagram (sectional view) of a solid-state imaging element according to an embodiment of the present invention.

A schematic configuration diagram (sectional view) of a solid-state imaging element is illustrated in FIG. 1 as an embodiment of the present invention. In this embodiment, the present invention is applied to a CMOS solid-state imaging element (CMOS image sensor).

In a solid-state imaging element 1, a charge accumulation region 3 serving as a photodiode PD is formed in a silicon substrate 2 of a photodiode section 41.

Further, a $p^+$ positive charge accumulation region 13 is formed on the surface of the charge accumulation region 3. The aforementioned HAD structure includes the charge accumulation region 3 and positive charge accumulation region 13.

In the photodiode section 41, a gate electrode 4 of a MOS transistor is formed on the silicon substrate 2 via a thin gate insulating film which is not shown.

In a peripheral circuit section 42, the gate electrode 4 of the MOS transistor is formed on the silicon substrate 2 via a thin gate insulating film which is not shown. Although not illustrated, source/drain region and semiconductor well regions of the MOS transistor are formed in the silicon substrate 2 of the peripheral circuit section 42. The semiconductor well regions serve as channels.

Further, a sidewall 5 is formed on the side of each of the gate electrodes 4 of the MOS transistor. The sidewall 5 is made up of an insulating layer.

Wiring layers 8, each made up of a metal wiring, are formed further above the gate electrode 4. The gate electrode 4 and each of the wiring layers 8 on different layers are insulated from each other by an interlayer insulating layer 6.

In the photodiode section 41, the wiring layer 8 on the first layer and the gate electrode 4 of the MOS transistor are electrically connected together by a conductive plug layer 7 which penetrates the interlayer insulating layer 6.

Further, in the peripheral circuit section 42, the wiring layer 8 on the first layer is electrically connected, for example, with the source/drain region (not shown) of the MOS transistor formed in the silicon substrate 2 by the conductive plug layer 7 which penetrates the interlayer insulating layer 6.

Each pixel includes the photodiode PD.

Each pixel has one or more MOS transistors including the one which includes the gate electrode 4 shown in FIG. 1.

An optical waveguide 21 is formed above the silicon substrate 2 in which the photodiode PD is formed. The optical waveguide 21 penetrates the interlayer insulating layer 6. The inner portion of the optical waveguide 21 includes a transparent material having a higher refractive index than the interlayer insulating layer 6.

A passivation film 9 and planarizing film 10 are formed further above the interlayer insulating layer 6 and optical waveguide 21. The passivation film 9 serves as a protective film.

It should be noted that the change in properties of the MOS transistors and other components by incident light can be suppressed by providing an unshown light-shielding film in the peripheral circuit section 42.

A color filter 11 is formed on the planarizing film 10.

A filter of appropriate color (e.g., red R, green G or blue B) is provided for each pixel as the color filter 11.

A spherical on-chip lens 12 is disposed on the color filter 11 to collect light.

In the solid-state imaging element 1 of the present embodiment configured as described above, the sidewall of the optical waveguide 21 which is the interface with the interlayer insulating layer 6 totally reflects light from above FIG. 1 if this light is incident upon the interface at an angle greater than the critical angle.

This permits collection of the incident light into the photodiode PD located under the optical waveguide 21, thus ensuring efficiency in the reception and detection of light.

Further, in the solid-state imaging element 1 of the present embodiment, the inner portion of the optical waveguide 21 in particular includes an insulating layer 22 with negative fixed charge.

An insulating material with a dielectric constant of 5 or greater and sufficient negative fixed charge is used as the insulating layer 22. Among materials having such properties are hafnium oxides and insulating materials containing at least one of hafnium, zirconium, aluminum, tantalum, titanium, yttrium and lanthanoid elements.

Such materials include, among the oxides and oxide nitrides containing any of the above elements, those having negative fixed charge, and other materials having negative fixed charge.

Incidentally, hafnium oxides have a dielectric constant of 20 or greater.

In order to ensure that the insulating layer 22 functions as the optical waveguide 21, however, a material must be selected which is higher in refractive index than the material of the interlayer insulating layer 6.

For example, hafnium oxides have a refractive index of about 2, which is higher than that (1.46) of $SiO_2$ used for the interlayer insulating layer 6.

Figure 12A:
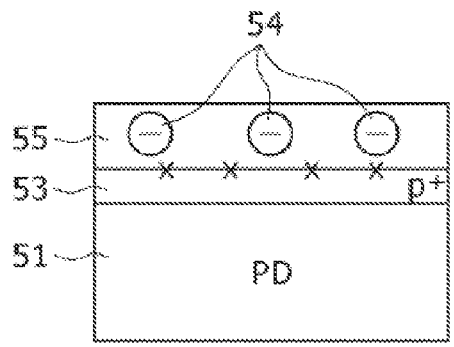
FIGS. 12A and 12B are diagrams describing the case in which an insulating layer with negative fixed charge is formed on the silicon layer containing the photodiode.
Figure 12B:
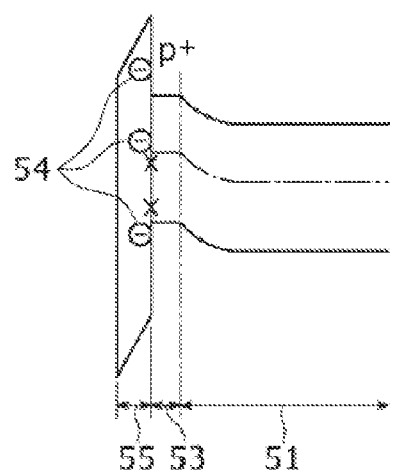

Because the optical waveguide 21, which includes the insulating layer 22 with negative fixed charge, is provided on top of the silicon substrate 2, the band is bent in the same manner as illustrated in FIGS. 12A and 12B, thus allowing for accumulation of positive charge (holes) in the vicinity of the interface.

It should be noted that, because of its refractive index of 2 or so, a hafnium oxide can provide an anti-reflection effect by adjusting the thickness thereof.

The solid-state imaging element 1 of the present embodiment can be, for example, manufactured as described below.

Figure 2:
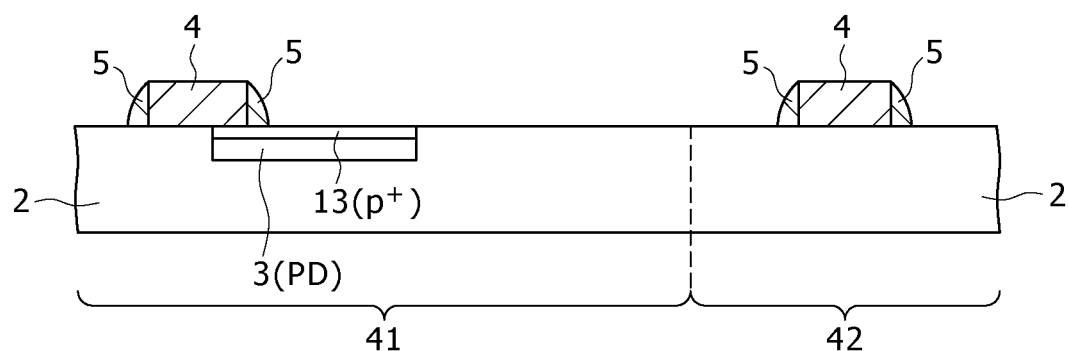
FIG. 2 is a manufacturing process diagram illustrating the manufacturing method of the solid-state imaging element shown in FIG. 1.

The photodiode PD and transistor of the photodiode section 41 and the transistor of the peripheral circuit section 42 are formed on the silicon substrate 2 as illustrated in FIG. 2.

Further, the $p^+$ positive charge accumulation region 13 is formed on the surface of the charge accumulation region 3 of the photodiode PD.

Figure 3:
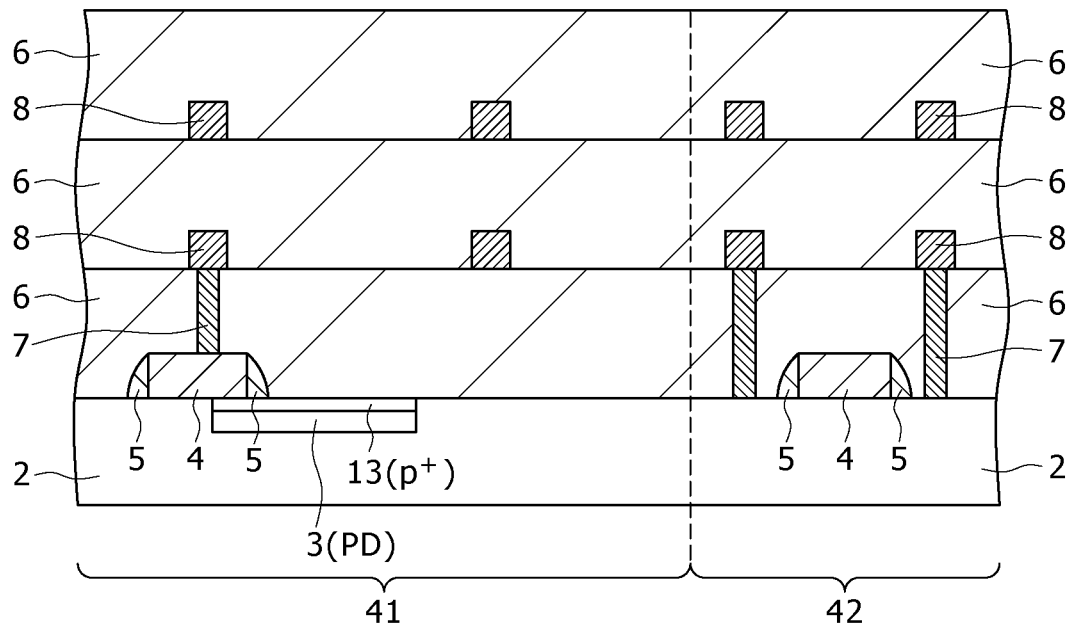
FIG. 3 is a manufacturing process diagram illustrating the manufacturing method of the solid-state imaging element shown in FIG. 1.

Next, the interlayer insulating layer 6, conductive plug layer 7 and wiring layers 8 are formed on the silicon substrate 2 on which the photodiode PD is formed as shown in FIG. 3.

That is, the interlayer insulating layer 6 made, for example, of $SiO_2$ film of given thickness, is deposited across the surface of the silicon substrate 2. The interlayer insulating layer 6 is selectively opened to form a contact hole reaching the silicon substrate 2. Then, a conductive material made of tungsten or other metallic material is introduced into the contact hole to form the conductive plug layer 7. Further, the wiring layer 8 is formed on the conductive plug layer 7 using a conductive material.

Figure 4:
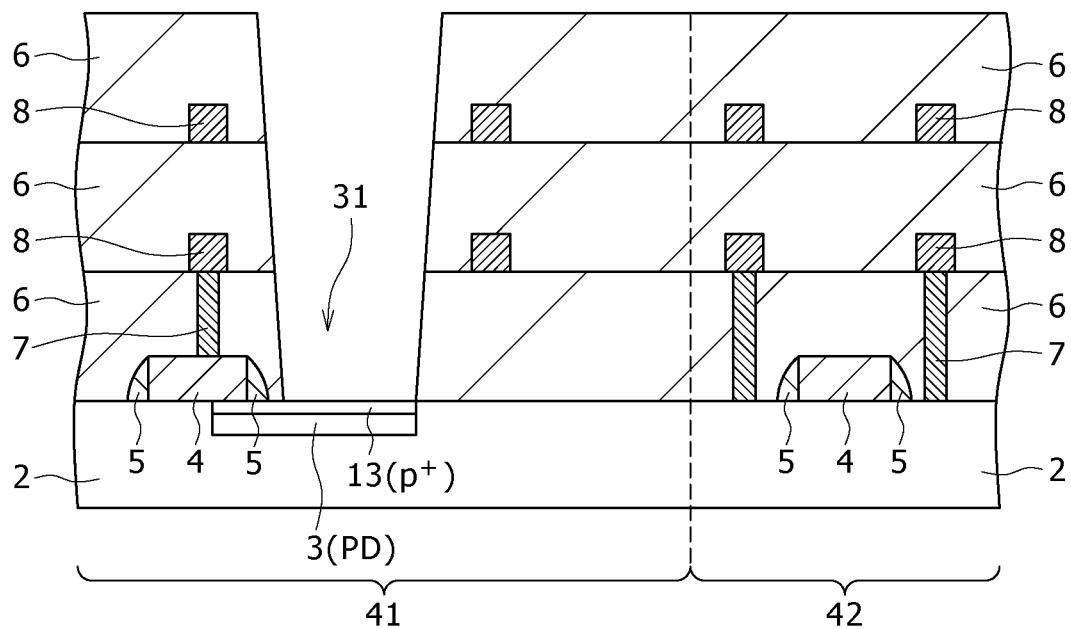
FIG. 4 is a manufacturing process diagram illustrating the manufacturing method of the solid-state imaging element shown in FIG. 1.

Next, each of the interlayer insulating layers 6 is dry-etched to form a groove 31 serving as the optical waveguide 21 as illustrated in FIG. 4.

At this time, negative fixed charge can achieve an improved hole accumulation effect if the interlayer insulating layers 6 are etched close to the silicon substrate 2.

Next, the insulating layer 22 with negative fixed charge is formed in the groove 31 using the aforementioned hafnium oxide or other insulating material.

Then, the surface is globally planarized by the CMP or etchback method.

The passivation film 9 and planarizing film 10 are sequentially stacked and formed on the planarized surface.

Next, the color filter 11 of appropriate color is formed for each pixel.

Figure 5:
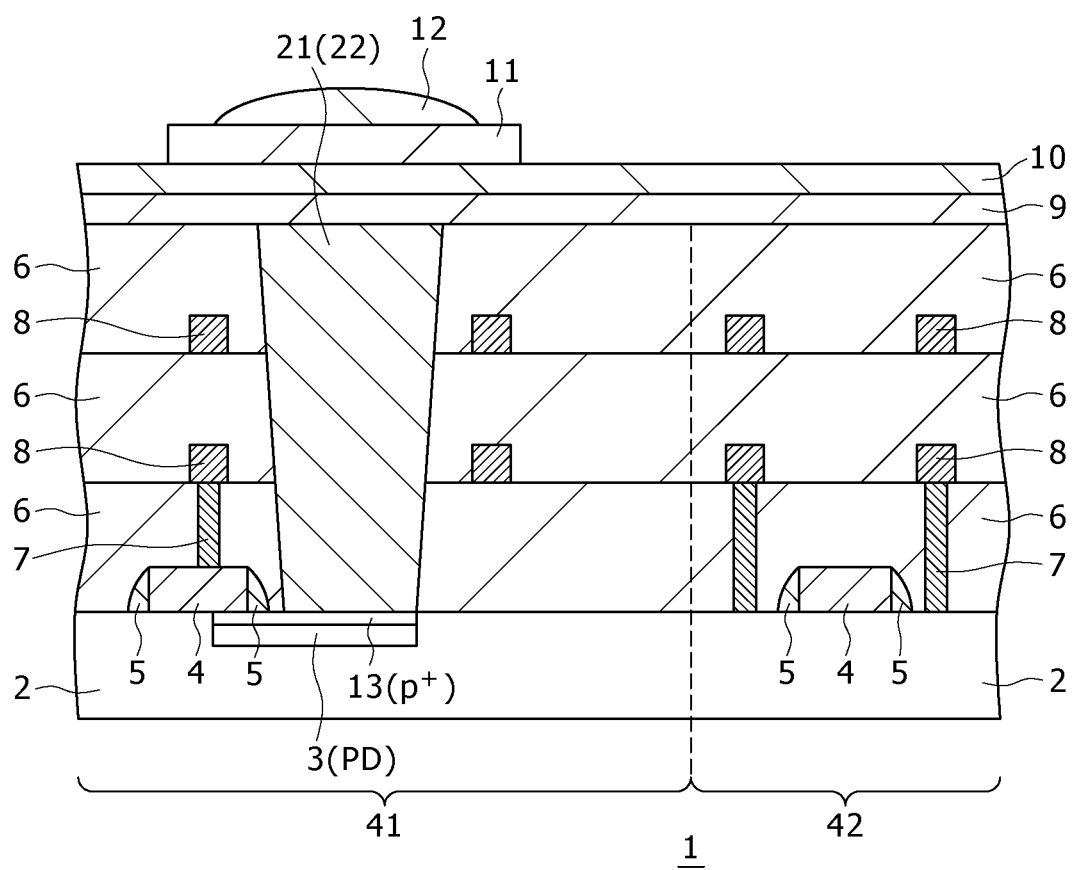
FIG. 5 is a manufacturing process diagram illustrating the manufacturing method of the solid-state imaging element shown in FIG. 1.

This is followed by the formation of the on-chip lens 12 on the color filter 11 (refer to FIG. 5 for the above).

The solid-state imaging element 1 shown in FIG. 1 can be manufactured as described above.

According to the configuration of the solid-state imaging element 1 of the present embodiment, the inner portion of the optical waveguide 21 includes the insulating layer 22 with negative fixed charge. This makes it possible to bend the band in the same manner as illustrated in FIGS. 12A and 12B, thus allowing for accumulation of positive charge (holes) in the vicinity of the interface (surface of the silicon substrate 2).

This, together with the positive charge accumulation region 13 of the silicon substrate 2, allows for accumulation of positive charge (holes) in the vicinity of the interface, thus suppressing the generation of dark current caused by an interface state.

Further, according to the present embodiment, the entire inner portion of the optical waveguide 21 is formed with the insulating layer 22 with negative fixed charge. This translates into a large amount of negative fixed charge, thus providing a sufficiently large hole accumulation effect (negative bias effect).

Therefore, the present embodiment can provide a highly reliable solid-state imaging element capable of operating stably without generating any dark current.

Figure 6:
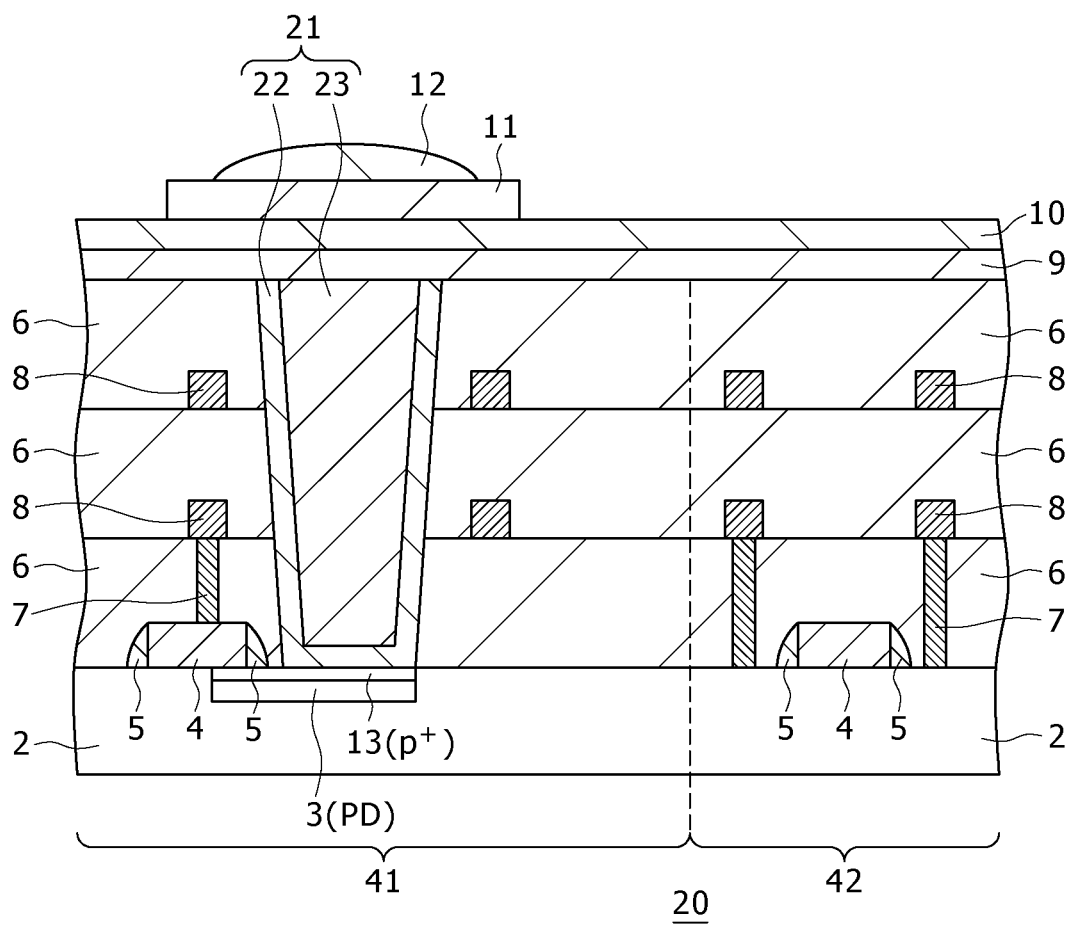
FIG. 6 is a schematic configuration diagram (sectional view) of a solid-state imaging element having an insulating film with negative fixed charge on part of the inner portion of an optical waveguide.

Here, a modified embodiment of the solid-state imaging element 1 according to the embodiment shown in FIG. 1 is shown in FIG. 6.

In the solid-state imaging element 1 shown in FIG. 1, the entire inner portion of the optical waveguide 21 is formed with the insulating layer 22 with negative fixed charge.

In a solid-state imaging element 20 shown in FIG. 6, on the other hand, part of the inner portion of the optical waveguide 21, i.e., the portion along the sidewall, is formed with the insulating layer 22 with negative fixed charge. The remaining portion is formed with an insulating layer 23 which is made of a similar material to that used for an existing optical waveguide (material high in refractive index).

Among materials which can be used as the insulating layer 23 for the remaining portion are silicon nitrides formed by the plasma CVD (chemical vapor deposition) method and polyimide resins formed by coating.

Even such a configuration can provide a sufficient hole accumulation effect (negative bias effect) thanks to the insulating layer 22 with negative fixed charge formed on the sidewall of the optical waveguide 21 to have a relatively large volume, thus suppressing the generation of dark current caused by an interface state.

Figure 7:
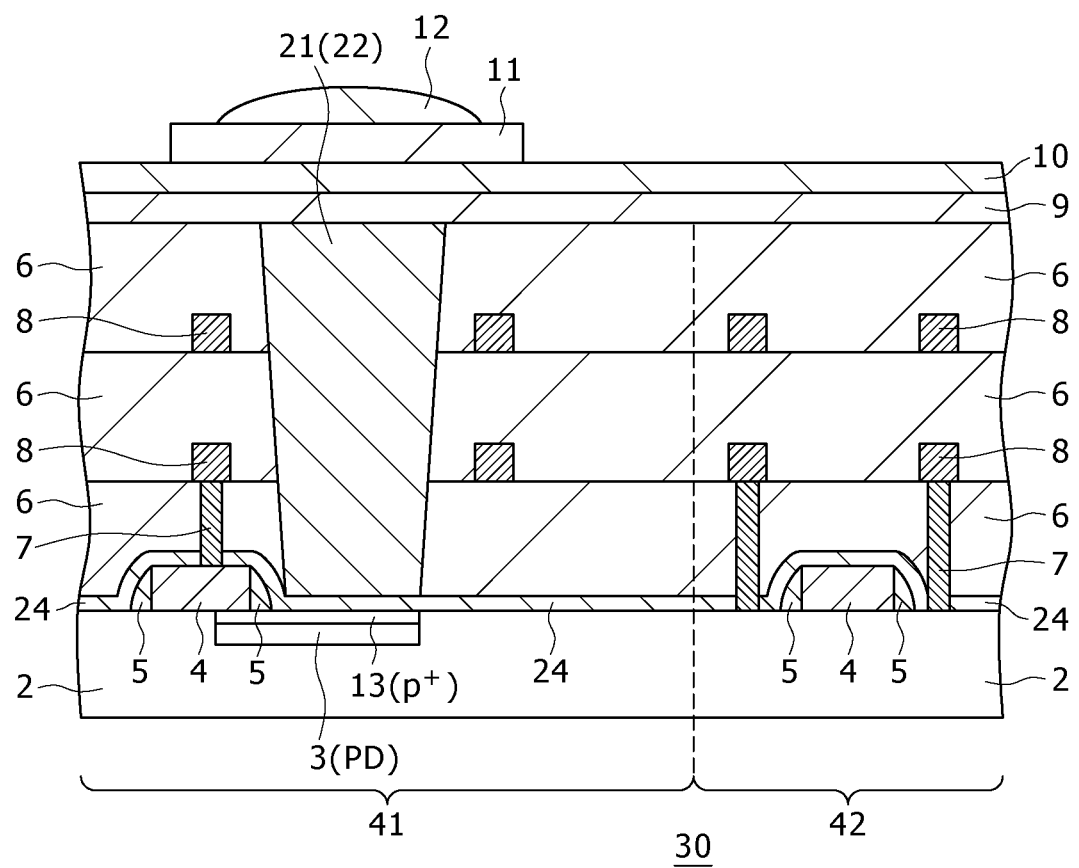
FIG. 7 is a schematic configuration diagram (sectional view) of a solid-state imaging element according to another embodiment of the present invention.

Next, a schematic configuration diagram (sectional view) of another embodiment of the present invention is shown in FIG. 7.

In a solid-state imaging element 30 of the present embodiment, an etching stopper film 24, used for the formation of the optical waveguide 21, is formed under the optical waveguide 21.

Further, the inner portion of the optical waveguide 21 is formed with the insulating layer 22 with negative fixed charge, as with the solid-state imaging element 1 shown in FIG. 1.

An insulating material having an etching selectivity with respect to the material (e.g., SiO$_2$) of the interlayer insulating layer 6 should preferably be selected for use as the stopper film 24. For example, SiN can be used.

The thickness of the stopper film 24 should preferably be selected to fall within the range from 1 nm to 20 nm in consideration of the etching conditions.

It should be noted that the excessively thick stopper film 24 will lead to a reduced hole accumulation effect of the insulating layer 22 with negative fixed charge.

According to the solid-state imaging element 30 of the present embodiment, the inner portion of the optical waveguide 21 is formed with the insulating layer 22 with negative fixed charge. As a result, positive charge (holes) can be accumulated in the vicinity of the interface (surface of the silicon substrate 2), as with the solid-state imaging element 1 shown in FIG. 1.

This, together with the positive charge accumulation region 13 of the silicon substrate 2, allows for accumulation of positive charge (holes) in the vicinity of the interface, thus suppressing the generation of dark current caused by an interface state.

Further, according to the present embodiment, the entire inner portion of the optical waveguide 21 is formed with the insulating layer 22 with negative fixed charge. This translates into a large amount of negative fixed charge, thus providing a sufficiently large hole accumulation effect (negative bias effect).

It should be noted, however, that the stopper film 24 has no negative fixed charge. This distances the insulating layer 22 with negative fixed charge from the interface of the stopper film 24, thus resulting in a slightly reduced hole accumulation effect (negative bias effect) as compared to the solid-state imaging element 1 shown in FIG. 1.

Figure 8:
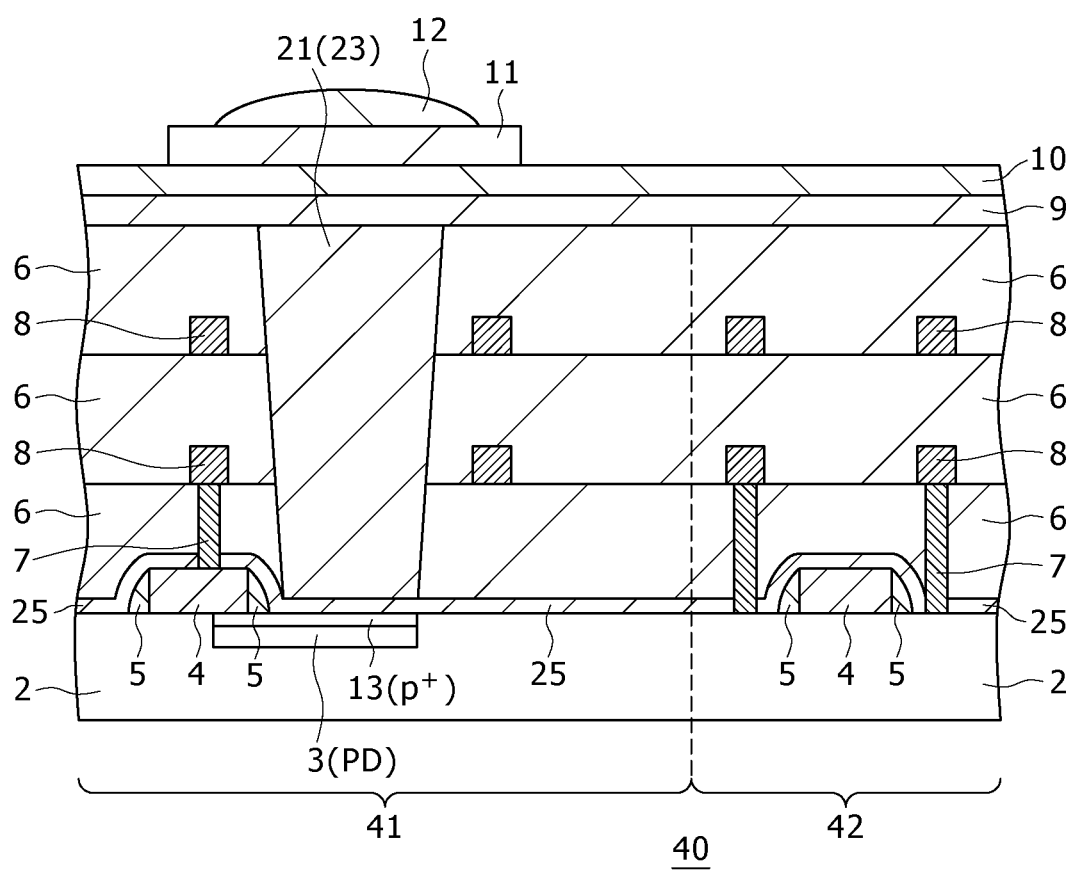
FIG. 8 is a schematic configuration diagram (sectional view) of a solid-state imaging element according to still another embodiment of the present invention.

Next, a schematic configuration diagram (sectional view) of still another embodiment of the present invention is shown in FIG. 8.

In the present embodiment, the etching stopper film, used for the formation of the optical waveguide 21, is made of a film with a dielectric constant of 5 or greater and sufficient negative fixed charge.

That is, in a solid-state imaging element 40 of the present embodiment, a stopper film 25 with negative fixed charge is formed on the silicon substrate 2, as illustrated in FIG. 8.

On the other hand, the inner portion of the optical waveguide 21 is formed with the insulating layer 23 which is made of a similar material to that used for an existing optical waveguide (material high in refractive index).

Except for the above, the solid-state imaging element 40 is identical in configuration to the solid-state imaging element 30 shown in FIG. 7.

In the present embodiment, hafnium oxides and insulating materials containing at least one of hafnium, zirconium, aluminum, tantalum, titanium, yttrium and lanthanoid elements can be used as the stopper film 25 with a dielectric constant of 5 or greater and sufficient negative fixed charge. Hafnium silicate (hafnium silicon oxide) can also be used.

However, a material having an etching selectivity with respect to the material of the interlayer insulating layer 6 should preferably be selected in order to ensure that the selected material functions properly as the stopper film 25.

It should be noted that a hafnium oxide has a refractive index of 2 or so. Therefore, a hafnium oxide can provide an anti-reflection effect by adjusting the thickness thereof.

On the other hand, among materials which can be used as the insulating layer 23 in the optical waveguide 21 are silicon nitrides formed by the plasma CVD method and polyimide resins formed by coating.

According to the configuration of the solid-state imaging element 40 of the present embodiment, the stopper film 25 with negative fixed charge is formed under the optical waveguide 21. As a result, positive charge (holes) can be accumulated in the vicinity of the interface (surface of the silicon substrate 2), as with the solid-state imaging element 1 shown in FIG. 1.

This, together with the positive charge accumulation region 13 of the silicon substrate 2, allows for accumulation of positive charge (holes) in the vicinity of the interface, thus suppressing the generation of dark current caused by an interface state.

Further, the insulating layer with negative fixed charge is formed closer to the photodiode PD than the optical waveguide 21, thus providing a sufficient hole accumulation effect (negative bias effect).

It should be noted that, in the present embodiment, the stopper film 25 is formed with an insulating material with negative fixed charge. Therefore, the formation of the thick stopper film 25 will increase the amount of negative fixed charge.

This makes it possible to provide a sufficiently large hole accumulation effect (negative bias effect) by forming the stopper film 25 thick to a certain extent.

Figure 9:
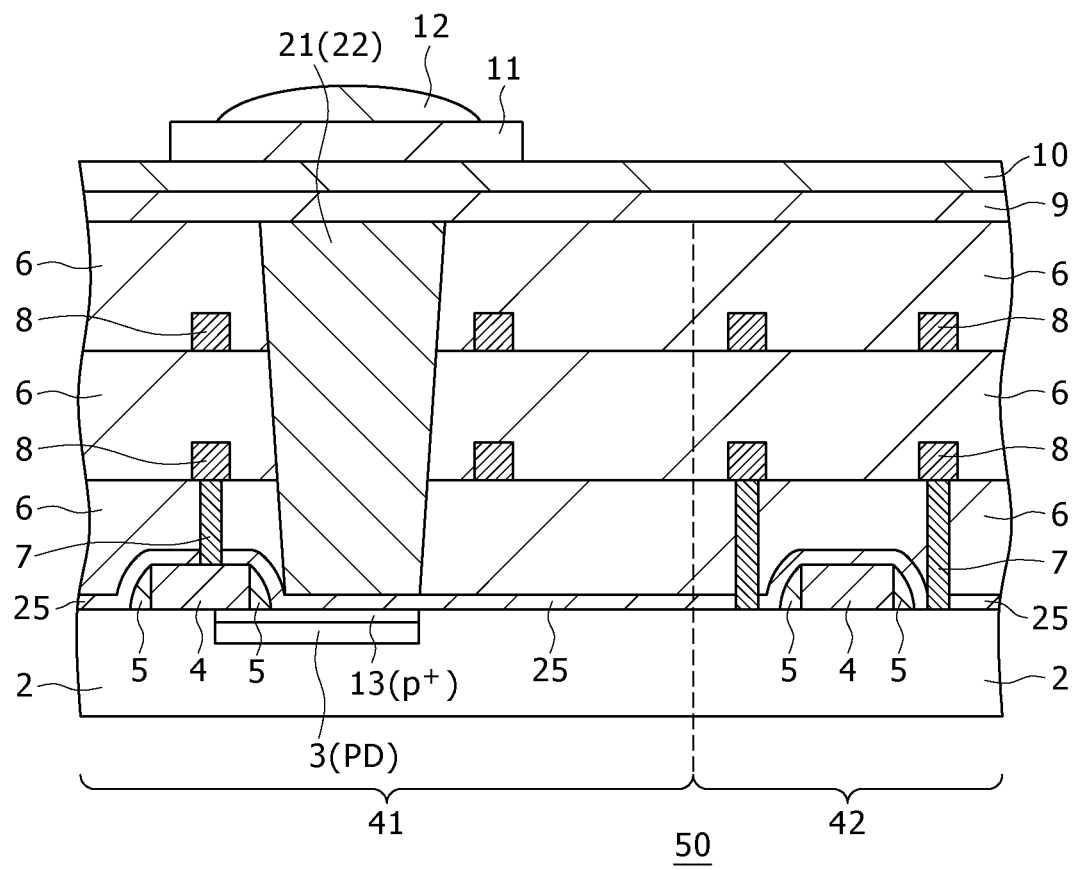
FIG. 9 is a schematic configuration diagram (sectional view) of a solid-state imaging element according to still another embodiment of the present invention.
Figure 10A:
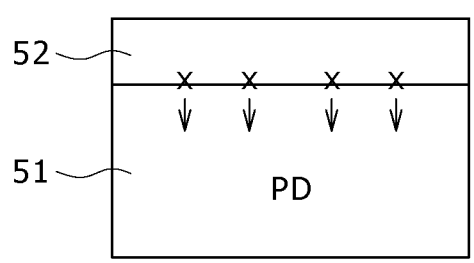
FIGS. 10A and 10B are diagrams describing the case in which an insulating layer is formed on a silicon layer containing a photodiode.
Figure 10B:
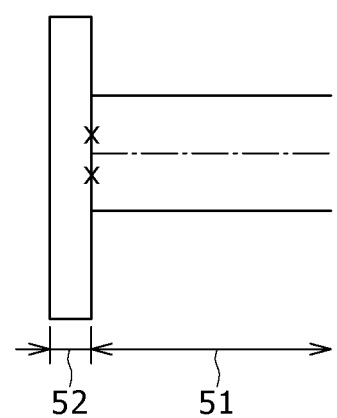
Figure 11A:
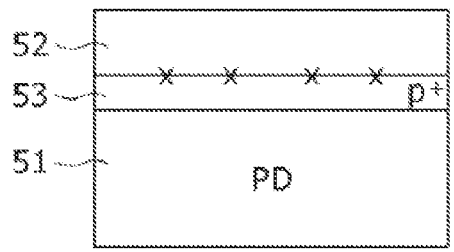
FIGS. 11A and 11B are diagrams describing the case in which a $p^+$ semiconductor region is formed to provide the HAD structure.
Figure 11B:
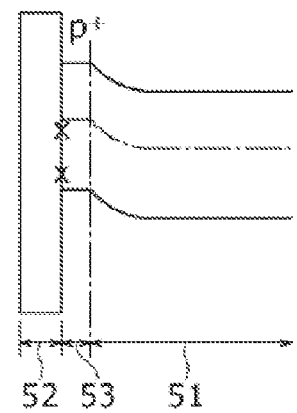

Next, a schematic configuration diagram (sectional view) of still another embodiment of the present invention is shown in FIG. 9.

In the present embodiment, the etching stopper film, used for the formation of the optical waveguide 21, and the insulating layer in the optical waveguide are both made of an insulating material with negative fixed charge.

That is, in a solid-state imaging element 50 of the present embodiment, the stopper film 25 with negative fixed charge is formed on the silicon substrate 2 as illustrated in FIG. 9. Further, the entire inner portion of the optical waveguide 21 is formed with the insulating layer 22 with negative fixed charge.

Except for the above, the solid-state imaging element 50 is identical in configuration to the solid-state imaging element 30 shown in FIG. 7.

According to the configuration of the solid-state imaging element 50 of the present embodiment, the stopper film 25 with negative fixed charge is formed under the optical waveguide 21. Further, the inner portion of the optical waveguide 21 includes the insulating layer 22 with negative fixed charge. As a result, positive charge (holes) can be accumulated in the vicinity of the interface (surface of the silicon substrate 2).

This, together with the positive charge accumulation region 13 of the silicon substrate 2, allows for accumulation of positive charge (holes) in the vicinity of the interface, thus suppressing the generation of dark current caused by an interface state.

Further, according to the present embodiment, the stopper film 25 with negative fixed charge is formed under the optical waveguide 21, and the entire inner portion of the optical waveguide 21 is formed with the insulating layer 22 with negative fixed charge. This translates into a large amount of negative fixed charge, thus providing a sufficiently large hole accumulation effect (negative bias effect).

Although applied to a CMOS solid-state imaging element (CMOS image sensor) in the aforementioned embodiments, the present invention is similarly applicable to solid-state imaging elements having other configuration such as a CCD solid-state imaging element.

Further, in the aforementioned embodiments, the photodiode PD is formed in the silicon substrate 2. However, the present invention is similarly applicable when the photodiode is formed in a silicon epitaxial layer on the silicon substrate rather than in a silicon layer.

Further, the two-layer inner portion of the optical waveguide 21 shown in FIG. 6 is applicable to the embodiment shown in FIG. 7 or 9. Still further, the inner portion of the optical waveguide may be formed to include three or more layers (including the insulating layer with negative fixed charge).

The present invention is not limited to the aforementioned embodiments, but may be modified in various ways within the scope of the invention.

What is claimed is:

1. A solid-state imaging element comprising:
a silicon layer comprising a photodiode formed therein and a positive charge accumulation region formed at a surface thereof;
a plurality of interlayer insulating layers on the silicon layer, wherein each interlayer insulating layer is associated with a wiring layer;
a gate electrode;
a conductive plug layer, wherein the conductive plug layer penetrates at least one of the plurality of interlayer insulating layers, and wherein the conductive plug layer electrically connects the wiring layer and the gate electrode; and
an optical waveguide formed above the photodiode to guide incident light into the photodiode,
wherein:
the optical waveguide penetrates the plurality of interlayer insulating layers,
the optical waveguide is formed entirely with an insulating layer having a negative fixed charge,
the optical waveguide is formed having a light-incident side and a non-light-incident side, and
the non-light-incident side formed directly in contact with the positive charge accumulation region.

2. The solid-state imaging element of claim 1, wherein the silicon layer is a silicon epitaxial layer on a silicon substrate.

3. The solid-state imaging element of claim 1, wherein the insulating layer of the optical waveguide is made of a material comprising hafnium.

4. A solid-state imaging element comprising:
a silicon layer comprising a photodiode formed therein and a positive charge accumulation region formed at a surface thereof;
a plurality of interlayer insulating layers on the silicon layer, wherein each interlayer insulating layer is associated with a wiring layer;
a gate electrode;
a conductive plug layer,
wherein the conductive plug layer penetrates at least one of the plurality of interlayer insulating layers, and
wherein the conductive plug layer electrically connects the wiring layer and the gate electrode; and
an optical waveguide formed above the photodiode to guide incident light into the photodiode,
wherein:
the optical waveguide penetrates the plurality of interlayer insulating layers,
the optical waveguide having a light-incident side and a non-light-incident side,
an insulating layer is formed on a sidewall and on the non-light-incident side of the optical waveguide, and
the insulating layer formed on the sidewall of the optical waveguide has a negative fixed charge,
the insulating layer is directly in contact with the positive charge accumulation region.

5. The solid-state imaging element of claim 4, wherein:
a second insulating layer is formed over the remaining portion of the optical waveguide, and
the second insulating layer is made of at least one of silicon nitride and polyimide resin.

6. The solid-state imaging element of claim 4, wherein at least a second insulating layer and a third insulating layer are formed over the remaining portion of the optical waveguide.

7. The solid-state imaging element of claim 4, wherein the silicon layer is a silicon epitaxial layer on a silicon substrate.

8. The solid-state imaging element of claim 4,
wherein the insulating layer is made of a material comprising hafnium.

* * * * *